(12) United States Patent
Zhang

(10) Patent No.: US 10,761,108 B2
(45) Date of Patent: Sep. 1, 2020

(54) MICROELECTROMECHANICAL SYSTEMS (MEMS) INERTIAL SENSORS WITH ENERGY HARVESTERS AND RELATED METHODS

(71) Applicant: Analog Devices, Inc., Norwood, MA (US)

(72) Inventor: Xin Zhang, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 94 days.

(21) Appl. No.: 15/818,713

(22) Filed: Nov. 20, 2017

(65) Prior Publication Data

US 2019/0154725 A1  May 23, 2019

(51) Int. Cl.
| | |
|---|---|
| *G01P 15/08* | (2006.01) |
| *G01P 15/125* | (2006.01) |
| *G01P 15/09* | (2006.01) |
| *H02N 2/18* | (2006.01) |
| *G01P 15/18* | (2013.01) |
| *H01L 41/113* | (2006.01) |

(52) U.S. Cl.
CPC ...... *G01P 15/0802* (2013.01); *G01P 15/0922* (2013.01); *G01P 15/125* (2013.01); *G01P 15/18* (2013.01); *H02N 2/186* (2013.01); *G01P 2015/0862* (2013.01); *H01L 41/1138* (2013.01)

(58) Field of Classification Search
CPC .............. G01P 15/0802; G01P 15/125; G01P 2015/0862; G01P 15/0922
See application file for complete search history.

(56) References Cited

U.S. PATENT DOCUMENTS

| | | |
|---|---|---|
| 7,327,003 B2 | 2/2008 | Martin et al. |
| 7,839,058 B1 | 11/2010 | Churchill et al. |
| 8,013,497 B2 | 9/2011 | Fujimoto |
| 8,680,695 B2 | 3/2014 | Huffman et al. |
| 9,467,074 B2 | 10/2016 | Lee et al. |
| 2003/0041767 A1* | 3/2003 | Rastegar ................. F41H 11/02 102/207 |
| 2007/0125176 A1* | 6/2007 | Liu ..................... H01L 41/1136 73/649 |
| 2008/0074002 A1 | 3/2008 | Priya et al. |

(Continued)

FOREIGN PATENT DOCUMENTS

| | | | |
|---|---|---|---|
| WO | WO 2017/070187 A1 | 4/2017 | |
| WO | WO 2017/139554 A1 | 8/2017 | |

*Primary Examiner* — Helen C Kwok
(74) *Attorney, Agent, or Firm* — Wolf, Greenfield & Sacks, P.C.

(57) ABSTRACT

A microelectromechanical system (MEMS) apparatus is described. The MEMS apparatus may comprise inertial sensors and energy harvesters configured to convert mechanical vibrational energy into electric energy. The harvested energy may be used to power an electronic circuit, such as the circuit used to sense acceleration from the inertial sensors. The inertial sensors and the energy harvesters may be disposed on the same substrate, and may share the same proof mass. The energy harvesters may include a piezoelectric material layers disposed on a flexible structure. When the flexible structures flexes in response to vibration, stress arises in the piezoelectric material layer, which leads to the generation of electricity. Examples of inertial sensors include accelerometers and gyroscopes.

20 Claims, 9 Drawing Sheets

(56) References Cited

U.S. PATENT DOCUMENTS

| | | | |
|---|---|---|---|
| 2008/0136292 A1* | 6/2008 | Thiesen | B60C 23/041 310/334 |
| 2008/0296984 A1* | 12/2008 | Honma | H02K 35/02 310/17 |
| 2009/0211353 A1* | 8/2009 | Gao | B60C 23/0411 73/146.5 |
| 2010/0236329 A1* | 9/2010 | Rastegar | F42C 11/008 73/514.34 |
| 2011/0074247 A1 | 3/2011 | Hohlfeld et al. | |
| 2011/0140579 A1 | 6/2011 | Moon et al. | |
| 2011/0291526 A1 | 12/2011 | Abramovich et al. | |
| 2012/0007469 A1* | 1/2012 | Matova | H01L 41/1136 310/322 |
| 2012/0161582 A1* | 6/2012 | Chung | B81C 1/00 310/339 |
| 2012/0206016 A1* | 8/2012 | Ayazi | F03G 7/08 310/339 |
| 2012/0206017 A1* | 8/2012 | Karkkainen | B60C 23/0411 310/339 |
| 2012/0267899 A1* | 10/2012 | Huffman | H01L 41/1138 290/1 R |
| 2012/0267900 A1* | 10/2012 | Huffman | H01L 41/1138 290/1 R |
| 2012/0318056 A1* | 12/2012 | Izumi | G01P 15/00 73/146.3 |
| 2013/0020910 A1* | 1/2013 | Ogawa | H01L 41/1136 310/339 |
| 2013/0127295 A1 | 5/2013 | Jun et al. | |
| 2013/0193930 A1* | 8/2013 | Baugher | H01L 41/1138 320/137 |
| 2014/0077662 A1* | 3/2014 | Lueke | H01L 41/1136 310/339 |
| 2014/0210423 A1* | 7/2014 | Goto | H01L 41/1138 320/139 |
| 2014/0310914 A1* | 10/2014 | Erlich | B81C 1/00523 16/225 |
| 2015/0008792 A1* | 1/2015 | Gong | H02N 2/186 310/319 |
| 2015/0015114 A1* | 1/2015 | Hall | H02N 2/181 310/319 |
| 2015/0145376 A1* | 5/2015 | Sun | H02N 2/188 310/339 |
| 2015/0188030 A1* | 7/2015 | Andosca | H01L 41/1136 310/319 |
| 2015/0280616 A1* | 10/2015 | Naito | G01P 15/0922 73/658 |
| 2016/0211439 A1* | 7/2016 | Najafi | H01L 41/0825 |
| 2016/0233413 A1* | 8/2016 | Zawada | H01L 41/053 |
| 2016/0245667 A1* | 8/2016 | Najafi | G01C 19/5783 |
| 2016/0322559 A1 | 11/2016 | Fuentes-Fernandez et al. | |
| 2017/0186940 A1* | 6/2017 | Bevilacqua | H01L 41/053 |
| 2018/0316287 A1* | 11/2018 | Xu | H02N 2/188 |

* cited by examiner

MICROELECTROMECHANICAL SYSTEMS (MEMS) INERTIAL SENSORS WITH ENERGY HARVESTERS AND RELATED METHODS

FIELD OF THE DISCLOSURE

The present application relates to microelectromechanical systems (MEMS) inertial sensors.

BACKGROUND

Some MEMS accelerometers include a proof mass configured to move in response to acceleration. The extent to which the proof mass moves provides an indication as to the magnitude of the acceleration. Some MEMS accelerometers use capacitive sensors to detect the amplitude of the proof mass' motion.

SUMMARY OF THE DISCLOSURE

According to one aspect of the present application, a microelectromechanical system (MEMS) apparatus is provided. The MEMS apparatus may comprise inertial sensors and energy harvesters configured to convert mechanical vibrational energy into electric energy. The harvested energy may be used to power an electronic circuit, such as the circuit used to sense acceleration with the inertial sensors. The inertial sensors and the energy harvesters may be disposed on the same substrate, and may share the same proof mass. The energy harvesters may include piezoelectric material layers disposed on a flexible structure. When the flexible structure flexes in response to vibration, stress arises in the piezoelectric material layer, which leads to the generation of electricity. Examples of inertial sensors include accelerometers and gyroscopes.

According to another aspect of the present application, a microelectromechanical system (MEMS) apparatus is provided. The MEMS apparatus may comprise a substrate having a top surface; an inertial sensor comprising a proof mass coupled to the substrate, the inertial sensor being configured to sense motion of the proof mass along at least one axis; and an energy harvester comprising a piezoelectric material layer formed between the substrate and the proof mass, wherein the piezo electric material layer is configured to produce an electric signal in response to motion of the proof mass in a direction that is perpendicular to the top surface of the substrate.

According to another aspect of the present application, a microelectromechanical system (MEMS) apparatus is provided. THE MEMS apparatus may comprise a substrate; a piezoelectric energy harvester comprising: a beam coupled to the substrate, wherein at least a portion of the beam comprises a piezoelectric material layer; a proof mass coupled to the beam; and an inertial sensor comprising: a first electrode coupled to the proof mass; and a second electrode coupled to the beam.

According to another aspect of the present application, a method for sensing motion using a microelectromechanical system (MEMS) apparatus is provided. The method may comprise converting, to electric energy, vibrational energy of a proof mass coupled to a substrate by sensing mechanical stress in a piezoelectric material layer formed between the proof mass and the substrate; with a sense circuit, sensing motion of the proof mass relative to the substrate along at least one axis; and powering the sense circuit at least in part with the electric energy.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Applicant has appreciated that, while MEMS devices (such as accelerometers, gyroscopes and resonators) are ubiquitous, the energy needed to power these devices is often limited, thus substantially restricting their usability. Certain sensor nodes, for example, are deployed in very remote locations, which can substantially increase the cost incurred to periodically replace the batteries. In another example, gyroscopes are mounted in smartphones and rely on the smartphone's battery for power. However, the batteries are shared among a variety of devices mounted in the smartphone, such as speakers, microphones, displays, the processors, etc. As a result, battery runtime is often as short as a few hours, thus limiting the time in which the gyroscopes can operate.

Applicant has appreciated that the usability of MEMS devices may be enhanced by equipping the MEMS devices with energy harvesters for capturing energy from the surrounding environment. In this way, the MEMS device's reliance on external power sources such as batteries may be limited, or even eliminated in some circumstances. Some aspects of the present application relate to MEMS apparatuses having a MEMS device (e.g., an inertial sensor) and an energy harvester disposed on the same substrate. Being on the same substrate, the location in which the power is generated and the location in which the power is used are close to one another, thus eliminating power losses that may otherwise arise if the MEMS device and the energy harvester were disposed on separate substrates. In some embodiments, the energy harvester may comprise a layer of piezoelectric material configured to generate electric charges when subjected to mechanical stress, thus converting mechanical energy into electric energy.

In some embodiments, the MEMS device includes an accelerometer configured to sense linear and/or angular acceleration. The piezoelectric energy harvester and the accelerometer may share the same proof mass. In these embodiments, motion of the proof mass in response to acceleration may have two effects: first, it may cause the energy harvester to capture at least some of the mechanical energy generated by the motion; second, it may cause the accelerometer to detect a signal indicative to the acceleration to which the proof mass is subjected.

Some MEMS apparatuses of the types described herein may be configured to capture energy from out-of-plane motion (e.g., towards or away from the substrate) of the proof mass and to detect out-of-plane motion of the proof mass. Other MEMS apparatuses of the types described herein may be configured to capture energy from out-of-plane motion of the proof mass and to detect in-plane motion (e.g., in a plane parallel to the substrate) of the proof mass. Yet other apparatuses of the types described herein may be configured to capture energy from out-of-plane motion of the proof mass and to detect in-plane and out-of-plane motion of the proof mass.

Figure 1:
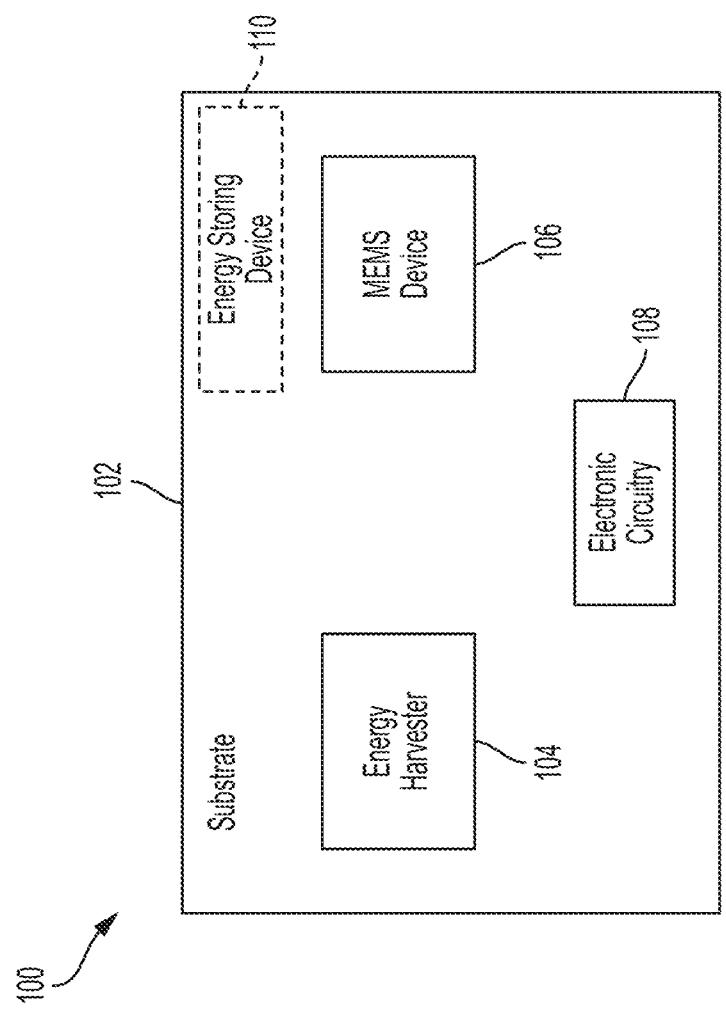
FIG. 1 is a block diagram illustrating a microelectromechanical system (MEMS) apparatus comprising an energy harvester and a MEMS device, according to some embodiments.

FIG. 1 is a block diagram illustrating a microelectromechanical (MEMS) apparatus 100, in accordance with some embodiments. MEMS apparatus 100 includes a substrate 102, energy harvester 104, MEMS device 106 and electronic circuitry 108. Energy harvester 104 and MEMS device 106 are disposed on substrate 106. While electronic circuitry 108 is also shown as being disposed on substrate 102, not all embodiments are limited in this respect as the electronic circuitry may alternatively be positioned outside the substrate.

Substrate 102 may be made using any suitable combination of materials. In some embodiments, substrate 102 is made of silicon (e.g., single crystal silicon). Energy harvester 104 may be arranged to harvest energy from the surrounding environment and to power one or more electronic components, such as MEMS device 106, electronic circuitry 108, and/or other devices disposed on or outside substrate 102. Energy harvester 104 may harvest mechanical energy (e.g., vibrational energy), electromagnetic energy, solar energy, thermal energy or any other type of energy. Optionally, MEMS apparatus 100 may include one or more energy storing devices 110 (such as batteries or super capacitors) for storing energy harvested by energy harvester 104.

MEMS device 106 may include any suitable device fabricated using MEMS techniques. In one example, MEMS device 106 includes one or more inertial sensors, such as linear and/or angular accelerometers and gyroscopes. In another example, MEMS device 106 includes one or more resonators. In the examples in which MEMS device 106 includes active components, that is, devices configured to be driven with electric signals, the power necessary to generate the electric signals may be at least partially provided by energy harvester 104.

Electronic circuitry 108 may include circuits for generating signals for driving MEMS device 106 and/or circuits for receiving signals generated by MEMS device 106. Additionally, or alternatively, electronic circuitry 108 may include circuits for performing other operations, such as for controlling the temperature of the substrate and/or for controlling other devices disposed on the substrate. Electronic circuitry 108 may be fabricated, at least in some embodiments, using complementary metal-oxide-semiconductors (CMOS) fabrication techniques. In the non-limiting embodiments in which MEMS device 106 includes one or more accelerometers, electronic circuitry 108 may include sense circuits for receiving sense signals generated by the accelerometer(s), and for determining the magnitude (and/or the direction) of the acceleration to which the accelerometer(s) are subjected. In the non-limiting embodiments in which the MEMS device includes one or more gyroscopes, electronic circuitry 108 may include sense circuits for sensing motion of the gyroscope(s) and/or drive circuits for driving the gyroscope(s)'s resonators.

Figure 2:
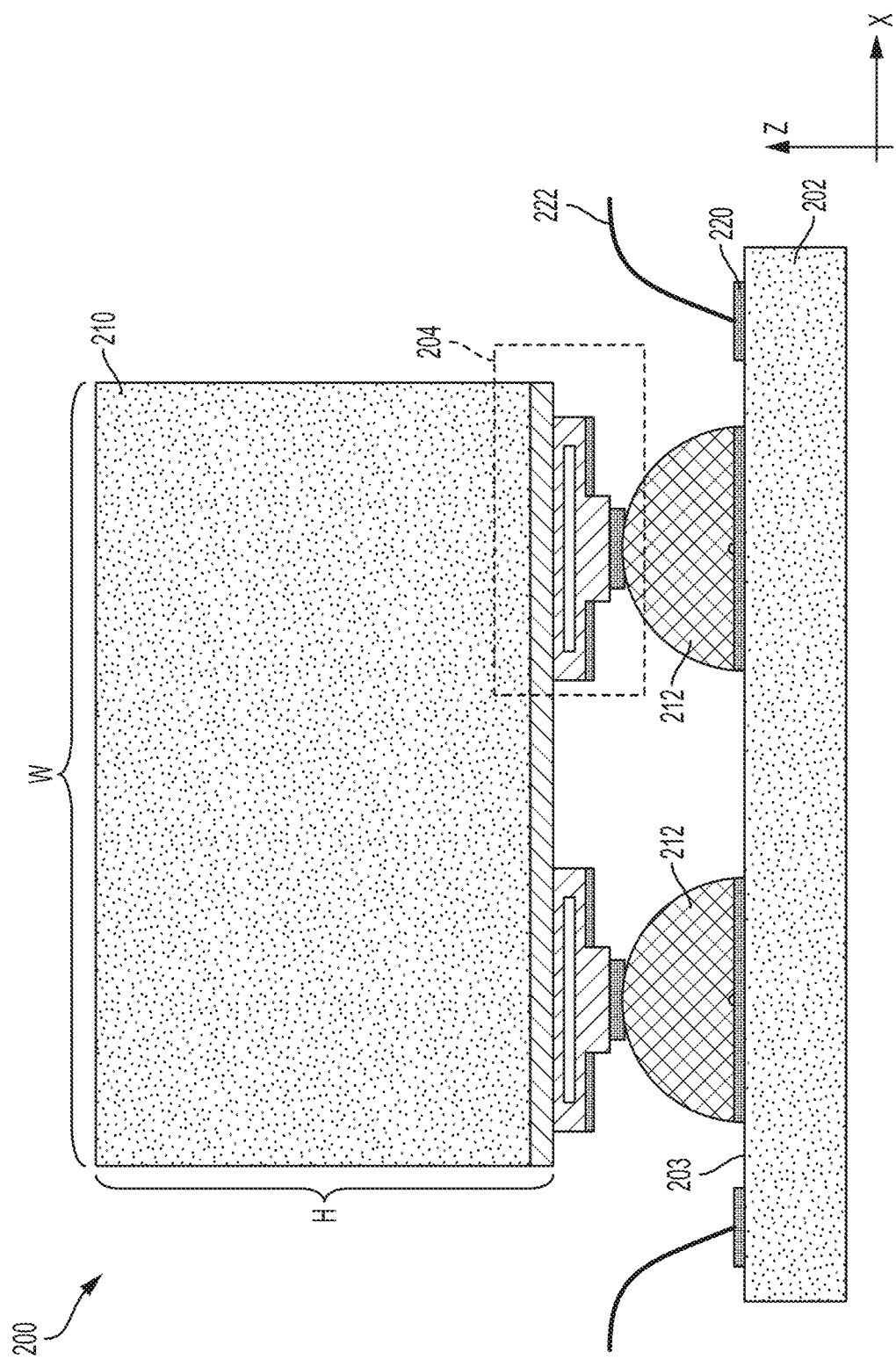
FIG. 2 is a cross sectional view illustrating an example of a MEMS apparatus comprising an energy harvester and a MEMS device, according to some embodiments.

In one specific example, energy harvester 104 includes one or more piezoelectric energy harvesters and MEMS device 106 includes one or more accelerometers. It should be appreciated, however, that not all embodiments are limited to this specific arrangement. An example of such a MEMS apparatus is depicted in FIG. 2, which illustrates an xz-plane cross sectional view. MEMS apparatus 200 includes a substrate 202 (which may serve as substrate 102) a proof mass 210, a plurality of connectors 212 coupling proof mass 210 to substrate 202, and inertial sensors 204, which are disposed between respective connectors 212 and proof mass 210.

In some embodiments, substrate 202 has a top surface 203, at least a portion of which being parallel to the xy-plane. Top surface 203 may represent the exposed surface of the substrate, such as the surface obtained through dicing, slicing, cleaving and/or etching of a silicon ingot. As illustrated in FIG. 2, proof mass 210 has a height H along the z-axis, a width W along the x-axis and a depth D along the y-axis (not shown in FIG. 2). The height, width and depth of the proof mass may be chosen to provide a desired inertial response. In some embodiments, the height H is sufficiently large to make the MEMS apparatus sensitive to low acceleration (such as less than 10 ng or less than 1 ng). For example, height H may be between 100 µm and 5 mm, between 300 µm and 5 mm, between 500 µm and 5 mm, between 500 µm and 3 mm, between 500 µm and 2 mm, between 500 µm and 1 mm, between 600 µm and 1 mm, between 700 µm and 700 µm, or any value or range within such ranges.

In some embodiments, MEMS apparatus 200 may be intended to be deployed in an environment predominantly subjected to low frequency vibrations (such as in wearable devices that are subject to body motion). As such, it may be desirable to set width W and depth D to be sufficiently large to enhance the response to vibrations in the low frequencies (e.g., less than 1 KHz, less than 100 Hz, less than 50 Hz, or less than 10 Hz). For example, width W and depth D may be between 500 µm and 1 cm, between 500 µm and 5 mm, between 1 mm and 1 cm, between 1 mm and 5 mm, between 5 cm and 10 cm, or within any range within such ranges. Other ranges are also possible. In at least some of the embodiments in which MEMS apparatus includes one or more accelerometers and one or more energy harvesters, motion of proof mass 210 may be leveraged to sense acceleration as well as to harvest energy.

Inertial sensors 204 may comprise a plurality of layers, and may be configured to harvest mechanical energy generated when proof mass 210 vibrates. As such, in some embodiments, inertial sensors 204 are compliant, thus allowing for motion of proof mass 210 relative to substrate 202.

In one example, at least one of the layers of inertial sensor 204 may be a piezoelectric material layer. The piezoelectric material layer may be arranged to generate electric charges when subjected to mechanical stress. Stress may arise, at least in some embodiments, when proof mass 210 moves relative to its position at rest. In one example, motion of the proof mass along the z-axis may cause the inertial sensor to flex, thus generating stress in the piezoelectric material layer. In response to the stress, the piezoelectric material may generate electric charges, which may be collected using conductive leads. In some embodiments, the electric energy generated in this manner may be used to at least partially power electronic circuitry which may be disposed on, in or outside substrate 202.

In some embodiments, inertial sensors 204 may be configured to sense motion of the proof mass 210. That is, inertial sensors 204 may generate electric signals that are indicative of the magnitude and/or direction of the motion of the proof mass. In the embodiments in which MEMS apparatus 200 operates as an accelerometer (as shown in FIG. 2), the magnitude and/or direction of the acceleration to which the proof mass is subjected may be inferred from the sensed motion of the proof mass. However, in the embodiments in which MEMS apparatus 200 operates as a gyroscope, the magnitude and/or direction of the angular velocity may be inferred from the sensed motion of the proof mass. MEMS apparatus 200 may operate as a 1-axis linear accelerometer (e.g., as a x-axis, y-axis, or z-axis linear accelerometer) as a 2-axis linear accelerometer (e.g., as a xy-plane linear accelerometer, xz-plane linear accelerometer or yz-plane linear accelerometer), as a 3-axis linear accelerometer, as a 1-axis angular accelerometer (e.g., as a x-axis, y-axis, or z-axis angular accelerometer) as a 2-axis angular accelerometer (e.g., as a xy-plane angular accelerometer, as a xz-plane angular accelerometer or as a yz-plane angular accelerometer), or as a 3-axis angular accelerometer.

Motion of the proof mass may be sensed, at least in some embodiments, using capacitive sensors. As such, inertial sensors 204 may comprise capacitors in some embodiments. The capacitors may be arranged such that the distance between their electrodes varies when the proof mass moves. Variations in the distance between the electrodes may lead to changes in the capacitance of the capacitor. Therefore, sense signals indicative of the motion of the proof mass may be generated in such embodiments by detecting variations in the capacitance.

Connectors 212 may be implemented in any of numerous ways. Examples of connectors 212 include, but are not limited to, grid ball arrays, solder bumps (as shown in FIG. 2), and copper pillars. In some embodiments, connectors 212 are made of a conductive material, thus enabling transfer of electrical signals through them. For example, sense signals generated in response to motion of proof mass 210 and or electric energy generated by converting vibrational energy of the proof mass may be transferred via connectors 212.

In some embodiments, MEMS apparatus 200 includes conductive pads, which may be formed on top surface 203. The conductive pads may be electrically connected to connectors 212 via metal lines (not shown in FIG. 2). The metal lines may be buried in the substrate or may be routed on top surface 203. In some embodiments, wire bonding to substrate 202 may be achieved by connecting wires 222 to conductive pads 220. In some embodiments, sense signals generated in response to motion of the proof mass may be routed outside the substrate 202 via the wire bonds for further processing. In some embodiments, the wire bonds may be used to transfer electric energy harvested by MEMS apparatus 200 outside substrate 202, thus powering other electronic circuits. It should be appreciated that, in some embodiments, sense circuitry for inferring the acceleration and/or velocity of the proof mass from the sense signals may be integrated in substrate 202. In some embodiments, the sense circuitry is powered, at least partially, with the harvested electric energy.

Figure 3A:
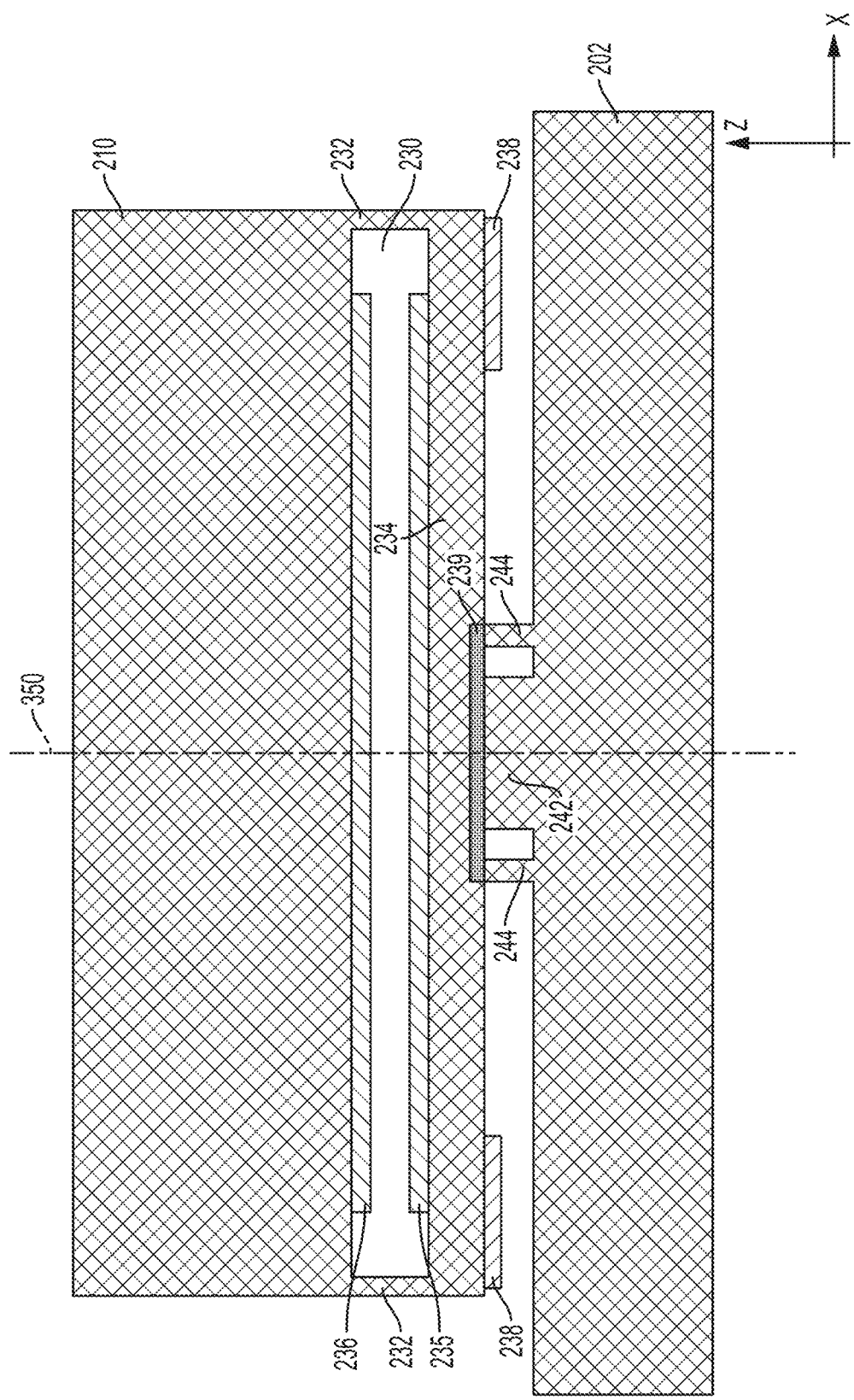
FIG. 3A is a cross sectional view illustrating an example of an inertial sensor comprising a piezoelectric material layer, according to some embodiments.

A non-limiting example of an inertial sensor 204 is depicted in FIG. 3A, in accordance with some embodiments. As illustrated, inertial sensor 204 may comprise a beam 234, a piezoelectric material layer 238, a recess 230, conductive layer 239, and electrodes 235 and 236. In some embodiments, beam 234 is made of the same material as proof mass 210, though not all embodiments are limited in this respect. For example, beam 234 and proof mass 210 may be made of poly-silicon. Beam 234 may be connected to proof mass 210 through support 232. In some embodiments, multiple supports 232 may be used to connect the proof mass to the beam. In some embodiments, support 232 may be wrapped around in the xy-plane, for example in a ring shape. In the example of FIG. 3A, support 232 is wrapped around the outer perimeter of recess 230. In some embodiments, recess 230 may be fully enclosed among proof mass 210, beam 234 and support(s) 232. In other embodiments, recess 230 may be only partially enclosed. For example, the support(s) may be arranged to only wrap around a portion of the outer perimeter of the recess 230.

Figure 3B:
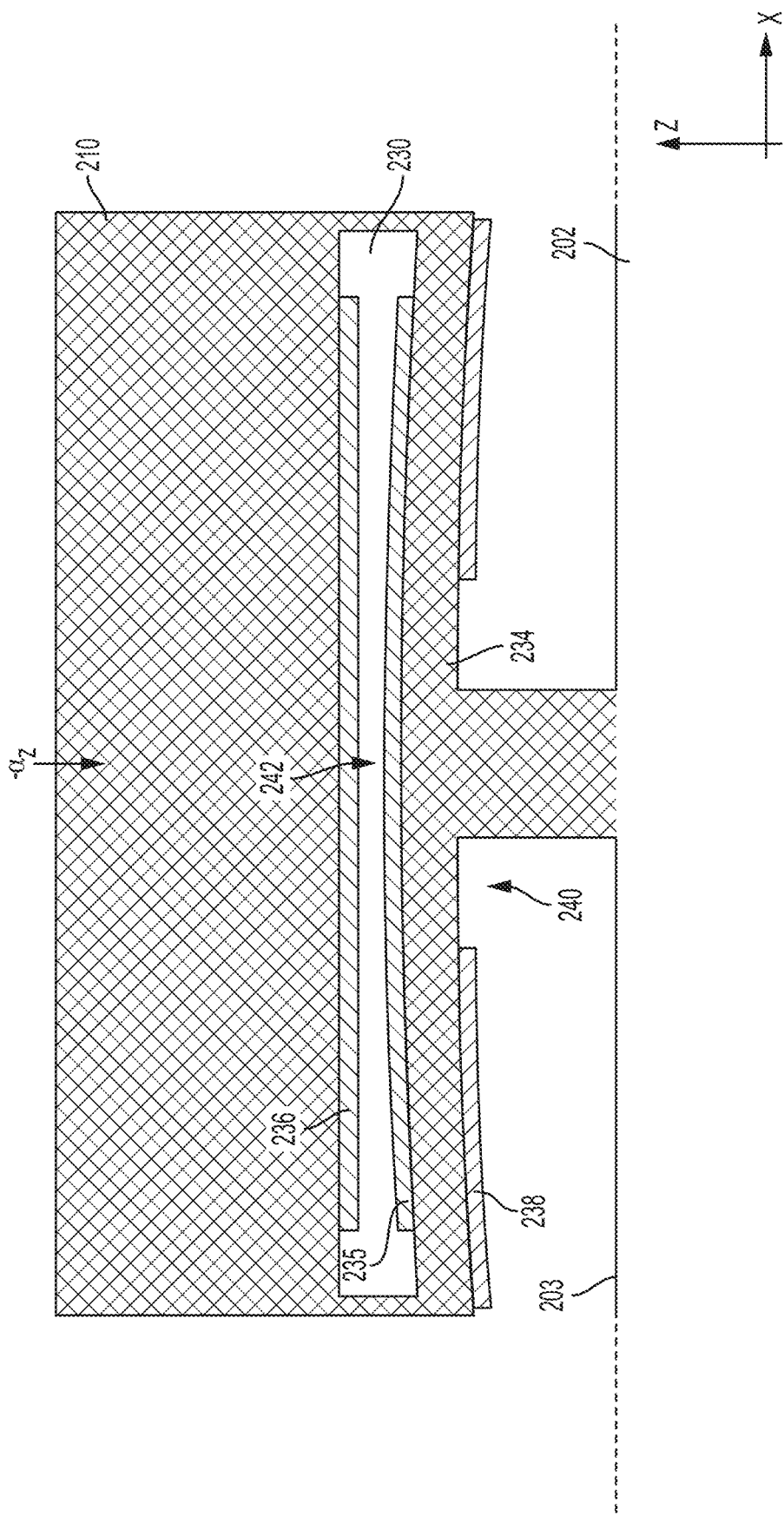
FIG. 3B illustrates the inertial sensor of FIG. 3A when subjected to an acceleration directed opposite the z-axis, according to some embodiments.
Figure 3C:
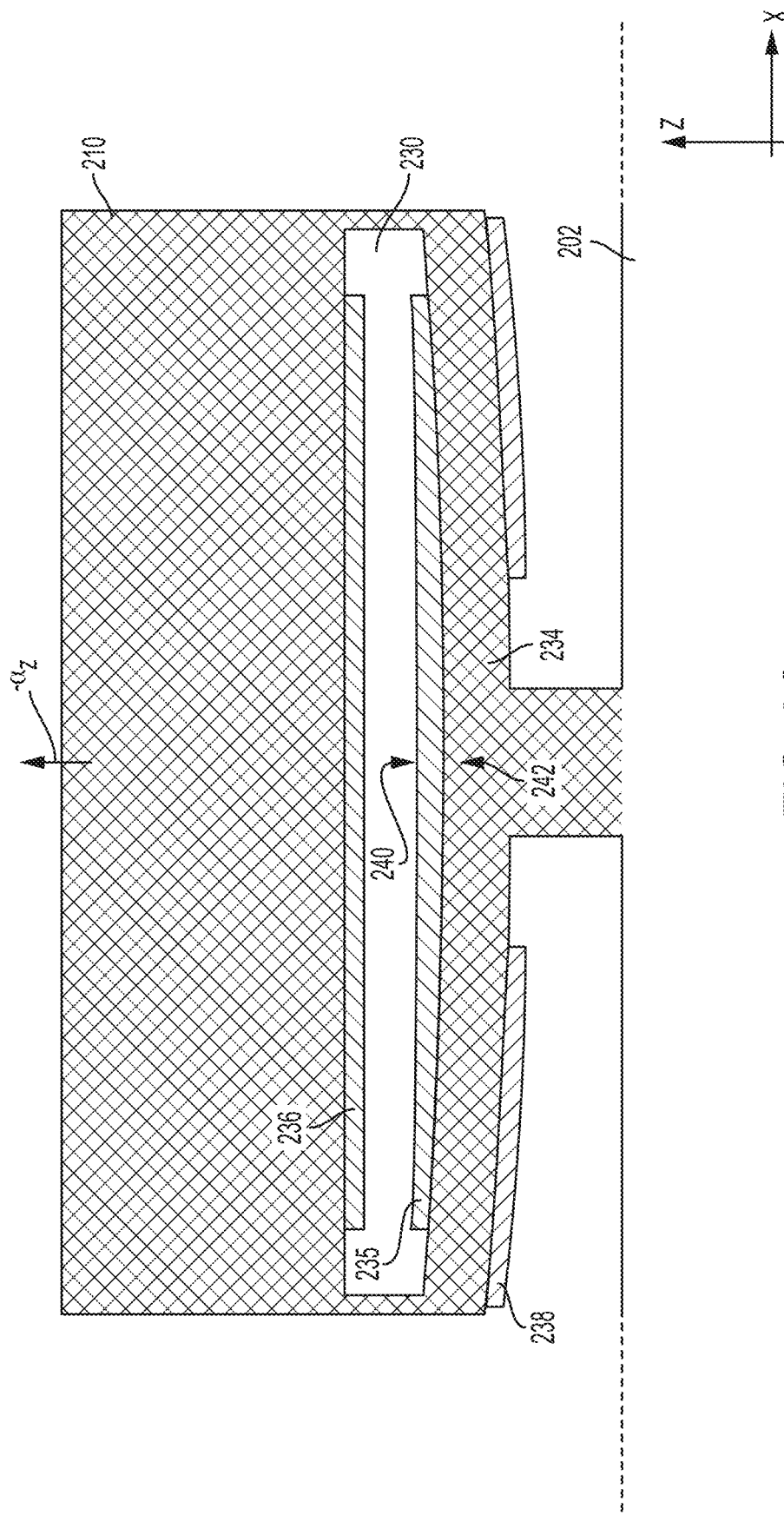
FIG. 3C illustrates the inertial sensor of FIG. 3A when subjected to an acceleration in the direction of the z-axis, according to some embodiments.

In some embodiments, beam 234 may flex in response to acceleration. FIG. 3B-3C illustrate the inertial sensor of FIG. 3A, when subjected to acceleration directed opposite the z-axis, and in the direction of the z-axis, respectively. As depicted in FIG. 3B, when the inertial sensor is subjected to an acceleration $-a_z$, directed opposite the z-axis, beam 234 may flex to allow motion of the proof mass 210. In this example, proof mass 210 moves towards the top surface 203 of substrate 202, and beam 234 flexes such that a concave surface 240 and a convex surface 242 are formed. Concave surface 240 may face the top surface 203 of substrate 202 while convex surface 242 may face away from top surface 203. As further illustrated in FIG. 3B, recess 230 may deform, relative to its shape at rest, when the proof mass 210 moves.

In some embodiments, the magnitude and/or direction of the acceleration may be sensed using a capacitive sensor. That is, the magnitude and/or direction of the acceleration may be inferred by sensing variations in the capacitance of a sense capacitor. In the configurations shown in FIGS. 3A-3C, the sense capacitors is formed between electrodes 235 and 236. As illustrated, electrode 235 may be disposed on beam 234, for example on the surface of the beam facing the proof mass 210. Electrode 236 may disposed on a surface of the proof mass 210, for example the outer surface of the proof mass that faces beam 234. Recess 320 (whether filled with a dielectric material, air or other types of gas or in vacuum), may serve as the insulating material between the electrodes.

When proof mass 210 moves opposite the z-axis, as illustrated in FIG. 3B, the overall distance between electrodes 235 and 236 may decrease. That is, while the distance of some portions of the electrodes may remain substantially unchanged or even increase (such as the edges of electrode 235), the average distance between the electrodes considered across the electrodes' surfaces is decreased. As a result, the capacitance of the sense capacitor is increased relative to the rest position (when no acceleration is applied). This variation in capacitance may be detected by a sense circuit, which may be disposed on or outside substrate 202 and may be configured to infer the magnitude and/or direction of the acceleration based on the variation in capacitance.

As further illustrated in FIG. 3B, piezoelectric material layer 238, which may be formed on a surface of beam 234 (though in some embodiments, beam 234 may itself be made of a piezoelectric material), may flex with the beam in the presence of acceleration $-a_z$. When flexed, the piezoelectric material layer 238 may experience stress (e.g., tensile or compressive stress). The stress may in turn give rise to electric charges due to the piezoelectric effect. As such, the piezoelectric material layer 238 may be viewed as a converter of vibrational energy to electric energy. It should be appreciated that piezoelectric material layer 238 may be made of any suitable piezoelectric material, such as materials having a piezoelectric coefficient $d_{33}$ (or $d_{31}$) that is greater, in absolute value, than $10^{-13}$ m/V, $10^{-12}$ m/V, $10^{-11}$ m/V or $10^{-10}$ m/V. Examples of materials that may be used for piezoelectric material 238 include, but are not limited to, lead zirconate titanate (PZT), aluminum nitride (AlN), or other group III-Nitride materials such as Gallium Nitride and Indium Nitride (InN).

In some embodiments, the electric charges generated in the piezoelectric material layer 238 in response to stress may be collected using conductive paths, and may be used to power one or more electronic devices or circuits. The conductive paths may be routed through conductive layer 239 (which may be disposed in contact with connectors 244 and may be, at least in some embodiments, made of nickel) and connectors 244 (shown in FIG. 3A, but not in FIGS. 3B-3C) to substrate 202. These electric charges may be routed outside the substrate (e.g., via wires 222) or may power circuits disposed in the substrate. One example of a circuit that may be powered using the electric charges generated by the piezoelectric material layer 238 is the sense circuitry described above.

The case in which an acceleration is applied in the same direction as the z-axis is depicted in FIG. 3C. As illustrated, beam 234 may flex to allow motion of the proof mass 210 in a direction perpendicular to the substrate's top surface. In this case, proof mass 210 moves away from top surface 203 of substrate 202, and beam 234 flexes such that a concave surface 240 and a convex surface 242 are formed. Convex surface 242 may face the top surface 203 of substrate 202 while concave surface 240 may face away from top surface 203. As further illustrated in FIG. 3C, recess 230 may deform, relative to its shape at rest. In this case, the overall distance between the electrodes 235 and 236 may increase, thus leading to a decrease in the capacitance of the sense capacitor. Such a decrease may be detected by the sense circuitry. As further illustrated in FIG. 3C, the piezoelectric material layer 238 may flex with the beam 234, and as a result, electric charges may be generated. As in the case illustrated in FIG. 3B, the electric charges may be used to power electronic circuits or devices. It should be appreciated that motion of the proof mass 210 relative to the substrate in directions other than those parallel to the z-axis may cause stress in the piezoelectric material layer 238, and as a result, convert mechanical energy to electric energy. For example, when motion of the proof mass 210 occurs along the x-axis, mechanical energy may be transferred to beam 234 via support(s) 232, thus causing warping of beam 234.

While the inertial sensor of FIGS. 3A-3C has been described as operating as an accelerometer, it should be appreciated that any other suitable types of inertial sensor may operate according to the techniques described herein. For example, in some embodiments, a gyroscope may be formed using proof mass 210. The gyroscope may comprise a resonator and a sensor. In some embodiments, proof mass 210 is part of both the resonator and the sensor. The resonator may be driven using a drive circuit (which may be disposed in or outside substrate 202), which may be powered at least in part using the electricity generated with piezoelectric material layer 238.

Figure 4:
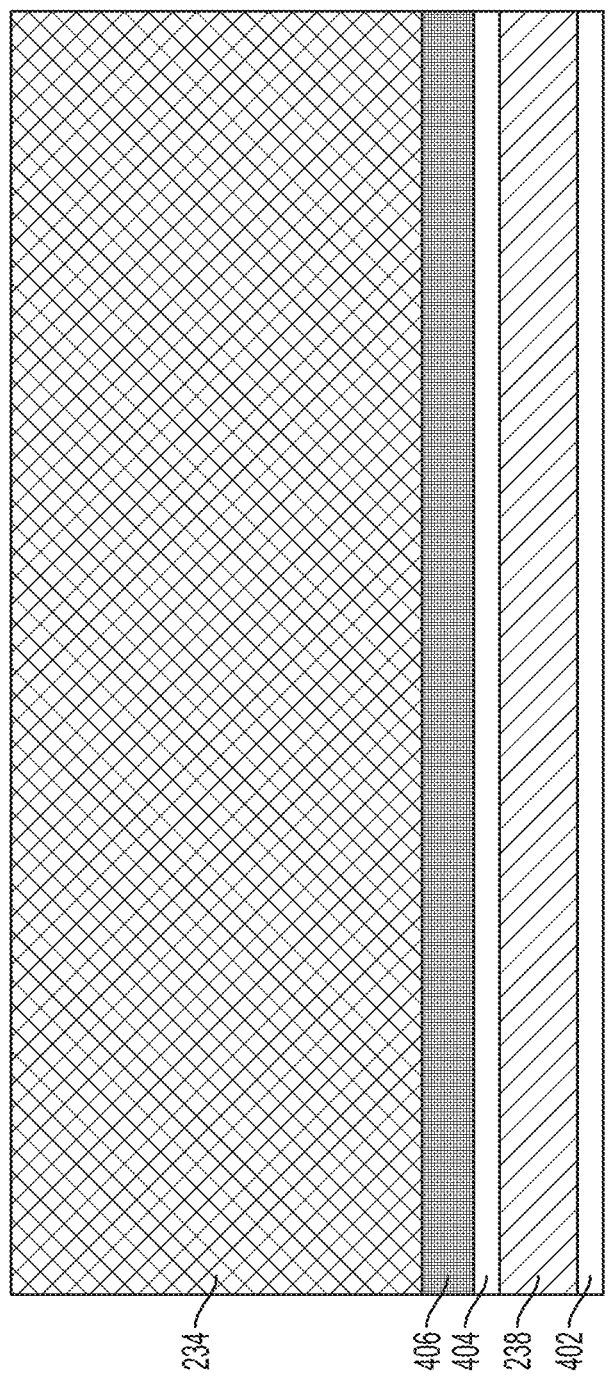
FIG. 4 is a cross sectional view illustrating a portion of the inertial sensor of FIG. 3A in additional detail, according to some embodiments.

FIG. 4 illustrates a portion of piezoelectric material layer 238 in additional detail, in accordance with some embodiments. In some embodiments, piezoelectric material layer 238 may be sandwiched between electrodes 402 and 404, which may be configured to form a capacitor with the piezoelectric material layer. As such, electric charges generated in the piezoelectric material 238 in response to stress may give rise to a voltage between electrodes 402 and 404. Electrodes 402 and 404 may be made of any suitable conductive material, including but not limited to aluminum, copper and molybdenum. The piezoelectric material layer 238 and the electrodes 402 and 404 may be connected to beam 234 via dielectric layer 406, which may be a silicon oxide layer in some embodiments. In one specific example, electrode 404 is in contact with dielectric layer 406, which is in contact with beam 234.

Figure 5B:
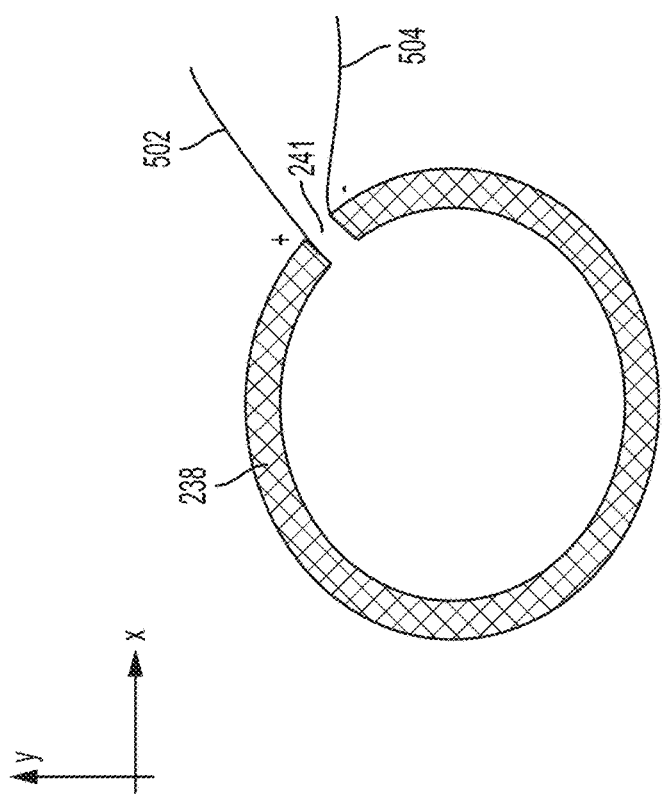
FIGS. 5A-5B are top views illustrating possible layouts for the piezoelectric material layer of FIG. 3A, according to some embodiments.
Figure 5A:
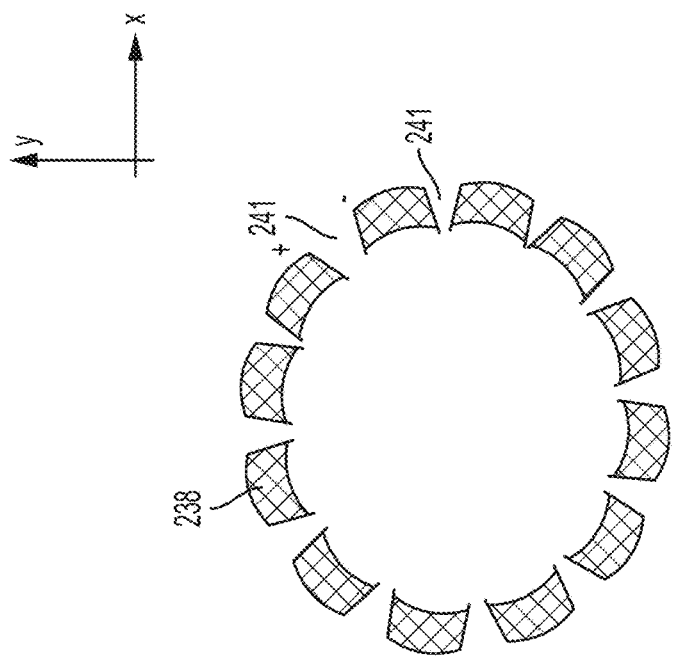

In some embodiments, the inertial sensor of FIG. 3A may exhibit a rotational symmetry with respect to axis 350 (shown in FIG. 3A), though not all embodiments are limited in this respect. In some such embodiments, piezoelectric material layer 238 may be shaped as a ring (or at least a portion of a ring) when viewed in the xy-plane. FIGS. 5A and 5B are two non-limiting examples illustrating how piezoelectric material layer 238 may be arranged in the xy-plane. In the example of FIG. 5A, piezoelectric material 239 is shaped as a ring having a gap 241. The two ends of the ring (labelled "+" and "−") may serve as terminals. That is, conductive lines 502 and 504 may be connected to the + and − ends and may be used to support currents when a voltage is generated between the + and − ends. Conductive line 502 may be connected to electrode 402 and conductive line 504 may be connected to electrode 404, though the opposite configuration is also possible.

In other embodiments, N gaps 241 may be formed along the length of the piezoelectric material layer 238, as shown in FIG. 5B. In this arrangement, the voltage generated between the + and − terminals may increase by a factor N relative to the case shown in FIG. 5A. However, the electric charge, and as a result the electric current, may decrease by a factor N relative to the case shown in FIG. 5A. As such, the number of gaps may be chosen to provide a desired balance between current and voltage. For example, in applications in which it is desirable to generate a large current, the number of gaps may be decreased. Otherwise, in applications in which it is desirable to generate a large voltage, the number of gaps may be increased. It should be appreciated that the gaps illustrated in FIGS. 5A-5B are not necessarily limited to use in connection with piezoelectric material layers having rotational symmetry.

The MEMS apparatus of FIG. 2 may be used to sense acceleration in one, two, or three dimensions, for example using multiple inertial sensors 204. Out-of-plane acceleration (in the z-axis direction) may be sensed by detecting common modes across the multiple sensors 204. In-plane acceleration (in the x-axis and/or the y-axis direction) may be sensed by detecting differential modes across the multiple sensors 204.

Figure 6B:
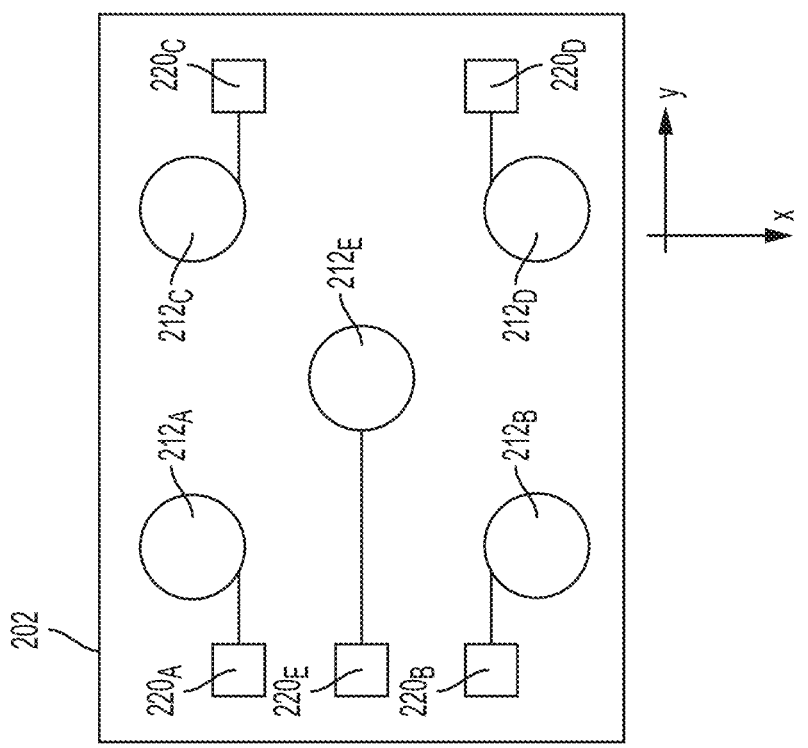
FIG. 6B is a top view illustrating the top surface of a substrate that may be used in connection with the proof mass of FIG. 6A, according to some embodiments.
Figure 6A:
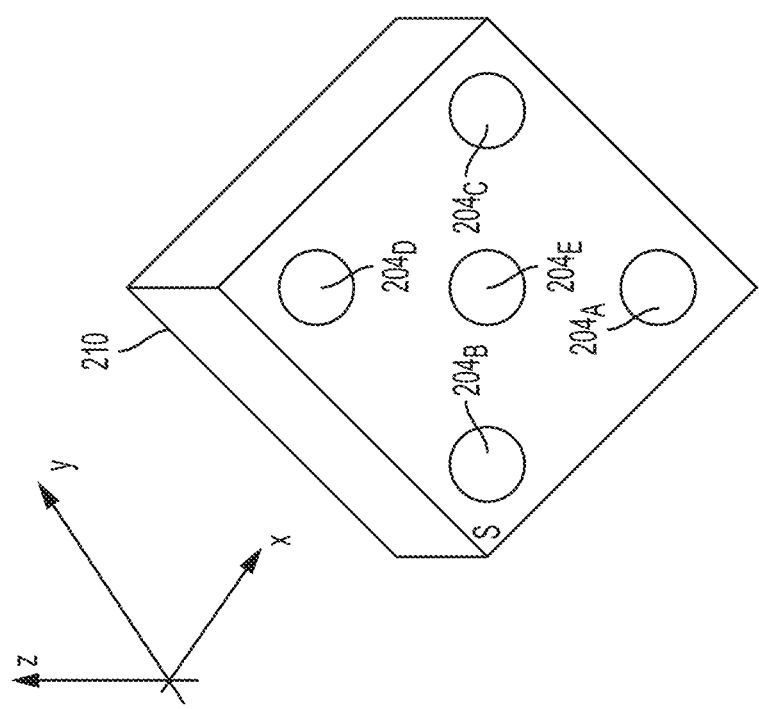
FIG. 6A is a perspective view of a proof mass comprising a plurality of inertial sensors, according to some embodiments.

FIG. 6A is a perspective view of a portion of a MEMS apparatus for sensing acceleration in three dimensions, in accordance with some embodiments. In particular, FIG. 6A illustrates the surface (labelled "S") of proof mass 210 that faces the top surface 203 of the substrate 202. In this configuration, proof mass 210 is coupled to five inertial sensors ($204_A$, $204_B$, $204_C$, $204_D$ and $204_E$) of the type described herein. In some embodiments, inertial sensors $204_B$ and $204_D$ are aligned along the y-axis, and so are inertial sensors $204_A$ and $204_A$. In some embodiments, inertial sensors $204_A$ and $204_B$ are aligned along the x-axis, and so are inertial sensors $204_C$ and $204_D$. FIG. 6B is a top view of a substrate 202 that can be used in connection with the proof mass of FIG. 6A. In this case, the substrate comprises connectors $212_A$, $212_B$, $212_C$, $212_D$, and $212_E$, which may be coupled, respectively, to inertial sensors $204_A$, $204_B$, $204_C$, $204_D$ and $204_E$. In addition, connectors $212_A$, $212_B$, $212_C$, $212_D$, and $212_E$ may be coupled, respectively, to conductive pads $220_A$, $220_B$, $220_C$, $220_D$ and $220_E$.

Common mode signals across the conductive pads $220_A$, $220_B$, $220_C$ and $220_D$ may be used to detect acceleration in the z-axis direction. Acceleration in the y-axis direction may be detected by sensing differential mode signals between conductive pads $220_A$ and $220_C$ and/or between the conductive pads $220_B$ and $220_D$. Acceleration in the x-axis direction may be detected by sensing differential mode signals between conductive pads $220_A$ and $220_B$ and/or between the conductive pads $220_C$ and $220_D$. The signals obtained from conductive pad $220_E$ may be used for calibration ad may be coupled to a pressure sensor for measuring the pressure exercised in the inertial sensor $204_E$. It should be appreciated that MEMS apparatuses of the types described herein are not limited to the specific number of inertial sensors or the specific arrangement illustrated in FIGS. 6A-6B, as any other suitable number of inertial sensors and arrangements may be used to sense acceleration in one, two or three dimensions.

MEMS apparatus 100 may be deployed in various settings to detect acceleration, velocity and/or angular rates including sports, healthcare, scientific, military, and industrial applications, among others. In some embodiments, MEMS apparatus 100 may be packaged in a wearable device deployed in monitoring sports-related physical activity and performance, patient health, military personnel activity, or other applications of interest of a user. In some embodiments MEMS apparatus 100 may be packaged in an implantable medical device, such as a pacemaker. In some embodiments, MEMS apparatus 100 may be deployed in a wireless sensor node that is part of a network of sensors. In one specific application, the network of sensors may be configured to sense earthquakes.

Figure 7:
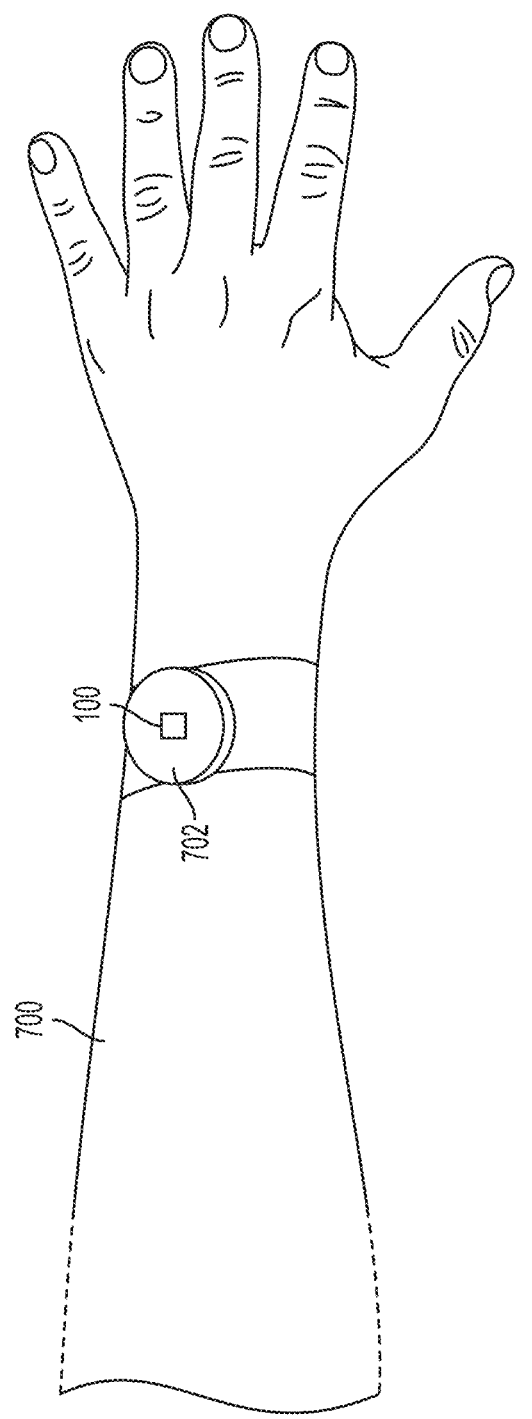
FIG. 7 is a schematic diagram illustrating a wearable device comprising the MEMS apparatus of FIG. 1, according to some embodiments.

In one illustrative example, MEMS apparatus 100 may be disposed on a wearable device, as illustrated in FIG. 7. In this case, MEMS apparatus 100 is disposed on a smartwatch 702. The MEMS apparatus may be arranged to enhance the energy harvested at low frequencies (such as the typical frequencies with which an arm 700 moves). For example, proof mass 210 may be sufficiently large to enhance the proof mass vibrational response in the low frequencies. MEMS apparatus 100 may be configured to sense linear and/or angular acceleration, and to harvest mechanical energy produced by the motion of arm 700.

Aspects of the present application may provide one or more benefits, some of which have been previously described. Now described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide a inertial sensor configured to harvest energy from the surrounding environment. In some embodiments, the inertial sensor and the energy harvester are disposed on the same substrate. As a result, energy captured through the harvester may be used to power the inertial sensor while avoiding power losses that may otherwise arise when transferring the energy from one substrate to another. Aspects of the present application provide an inertial sensor configured to power itself. As such, the inertial sensor may be configured to operate without batteries, or at least to minimize battery usage.

What is claimed is:

1. A microelectromechanical system (MEMS) apparatus comprising:
   a substrate having a top surface;
   an accelerometer comprising a proof mass coupled to the substrate and a capacitive sensor, the capacitive sensor of the accelerometer being configured to generate a sense signal in response to acceleration of the proof mass along at least one axis, the capacitive sensor having a first electrode coupled to the proof mass and a second electrode coupled to a beam;
   sense circuitry configured to receive the sense signal and to determine, based on the sense signal, a magnitude of the acceleration of the proof mass; and
   an energy harvester comprising a piezoelectric material layer coupled to the beam and formed between the substrate and the proof mass, wherein the piezoelectric material layer is configured to produce an electric signal in response to motion of the proof mass relative to the top surface of the substrate.

2. The MEMS apparatus of claim 1, wherein the at least one axis is parallel to the top surface of the substrate.

3. The MEMS apparatus of claim 2, wherein the accelerometer is a first accelerometer and the sense signal is a first sense signal, wherein the at least one axis is parallel to the top surface of the substrate, wherein the MEMS apparatus further comprises a second accelerometer comprising the proof mass, the second accelerometer being configured to generate a second sense signal in response to the acceleration of the proof mass along the at least one axis, and
   wherein the sense circuitry is configured to determine, in a differential manner and based on the first and second sense signals, the magnitude of the acceleration of the proof mass along the at least one axis.

4. The MEMS apparatus of claim 1, further comprising a recess formed between the beam and the proof mass, wherein the first and second electrodes are disposed on opposite sides of the recess.

5. The MEMS apparatus of claim 1, wherein the accelerometer is configured to generate the sense signal by sensing a variation in a capacitance of the capacitive sensor.

6. The MEMS apparatus of claim 1, wherein the beam is configured to flex in response to motion of the proof mass relative to the top surface of the substrate.

7. The MEMS apparatus of claim 1, wherein the proof mass and the beam form a recess, the recess being configured to deform in response to motion of the proof mass relative to the top surface of the substrate.

8. The MEMS apparatus of claim 1, wherein the sense circuitry is integrated in the substrate.

9. A microelectromechanical system (MEMS) apparatus comprising:
   a substrate;
   a piezoelectric energy harvester comprising:

a beam coupled to the substrate, wherein at least a portion of the beam comprises a piezoelectric material layer;

a proof mass coupled to the beam;

an accelerometer comprising a first electrode coupled to the proof mass and a second electrode coupled to the beam, wherein a recess separates the first electrode from the second electrode, the accelerometer being configured to generate a sense signal in response to acceleration of the proof mass; and sense circuitry configured to receive the sense signal and to determine, based on the sense signal, a magnitude of the acceleration of the proof mass.

10. The MEMS apparatus of claim 9, wherein the piezoelectric material layer is configured to generate an electric signal in response to an out-of-plane motion of the proof mass.

11. The MEMS apparatus of claim 9, wherein the accelerometer is configured to generate the sense signal in response to in-plane acceleration of the proof mass.

12. The MEMS apparatus of claim 9, wherein the recess further separates the proof mass from the beam.

13. The MEMS apparatus of claim 9, wherein the piezoelectric energy harvester further comprises third and fourth electrodes disposed on opposite sides of the piezoelectric material layer.

14. The MEMS apparatus of claim 9, wherein the piezoelectric material layer exhibits a rotational symmetry relative to an axis perpendicular to a top surface of the substrate and comprises one or more gaps.

15. The MEMS apparatus of claim 9, wherein the accelerometer is configured to generate the sense signal capacitively using the first and second electrodes.

16. The MEMS apparatus of claim 9, wherein the accelerometer is a first accelerometer, the sense signal is a first sense signal and the beam is a first beam, wherein the acceleration of the proof mass is in-plane, wherein:

the MEMS apparatus further comprises a second accelerometer having a third electrode coupled to the proof mass and a fourth electrode coupled to a second beam disposed between the substrate and the proof mass, wherein the second accelerometer is configured to generate a second sense signal in response to the in-plane acceleration of the proof mass, and wherein the sense circuitry is configured to determine, in a differential manner and based on the first and second sense signals, the magnitude of the in-plane acceleration of the proof mass.

17. A method for sensing motion using a microelectromechanical system (MEMS) apparatus, the method comprising:

converting, to electric energy, vibrational energy of a proof mass coupled to a substrate by sensing mechanical stress in a piezoelectric material layer coupled to a beam and formed between the proof mass and the substrate;

with a sense capacitor including a first electrode coupled to the proof mass and a second electrode coupled to the beam, generating a sense signal in response to acceleration of the proof mass along at least one axis;

with a sense circuit, receiving the sense signal and determining, based on the sense signal, a magnitude of the acceleration of the proof mass; and powering the sense circuit at least in part with the electric energy.

18. The method of claim 17, wherein the at least one axis is parallel to a top surface of the substrate.

19. The method of claim 17, wherein sensing mechanical stress in the piezoelectric material layer comprises generating an electric signal in response to the mechanical stress.

20. The method of claim 19, further comprising a recess formed between the proof mass and the beam, wherein the first and second electrodes are disposed on opposite sides of the recess.

* * * * *